HEARING AID AUTOMATIC GAIN CONTROL SYSTEM

Filed May 28, 1962 2 Sheets-Sheet 1

INVENTOR.
Walter S. Druz
BY James E. Tracy
Atty.

HEARING AID AUTOMATIC GAIN CONTROL SYSTEM

Filed May 28, 1962 2 Sheets-Sheet 2

INVENTOR.
Walter S. Druz
BY James E. Tracy
Atty.

United States Patent Office 3,189,841
Patented June 15, 1965

3,189,841
HEARING AID AUTOMATIC GAIN CONTROL SYSTEM

Walter S. Druz, Bensenville, Ill., assignor to Zenith Radio Corporation, Chicago, Ill., a corporation of Delaware Filed May 28, 1962, Ser. No. 198,226
4 Claims. (Cl. 330—29)

Figure 1:
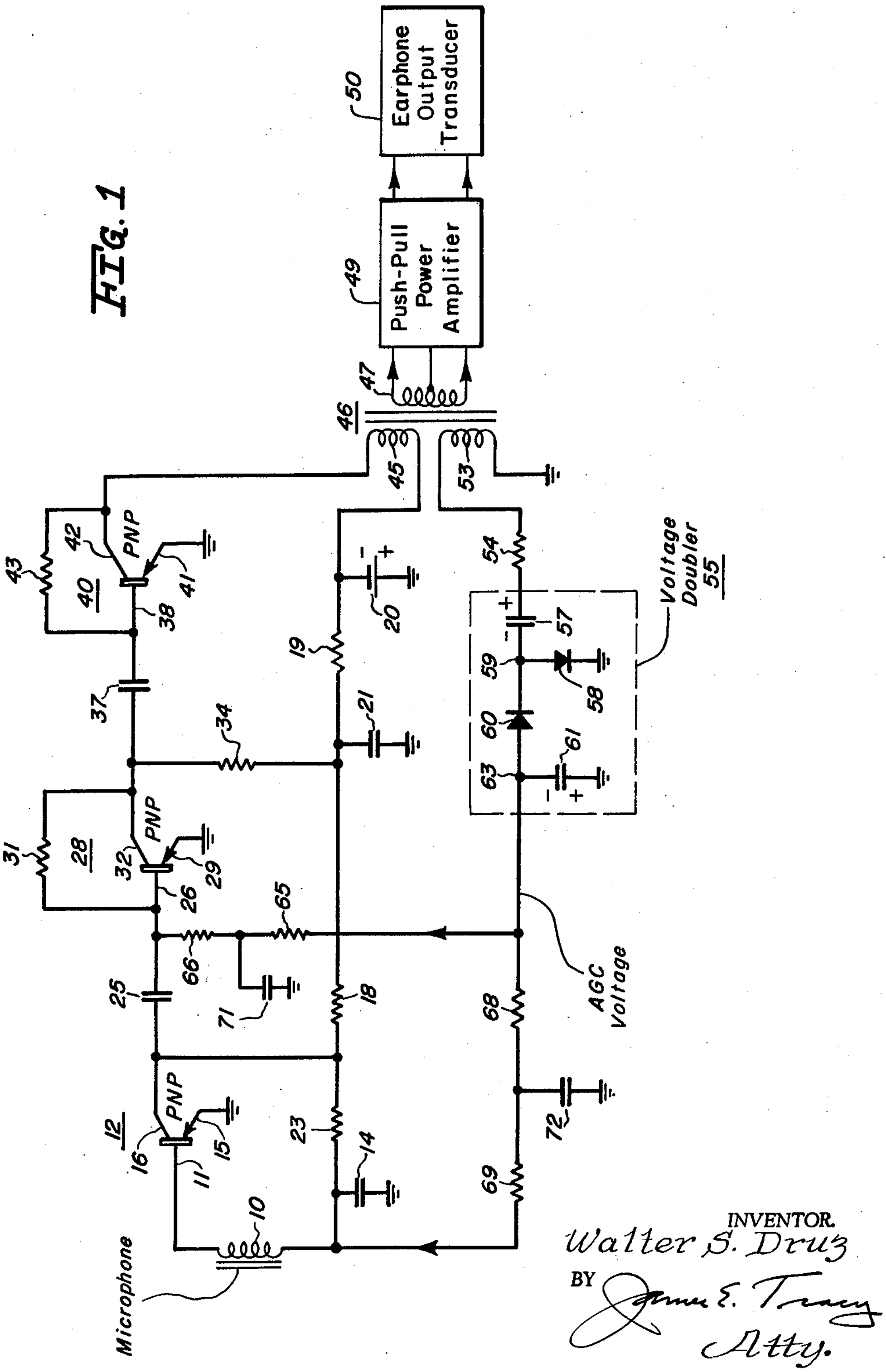

This invention relates in general to hearing aids and more particularly to an automatic gain control arrangement for miniaturized hearing aids.

The desirability of incorporating automatic gain control, sometimes referred to herein as AGC, in a hearing aid amplifier has long been appreciated. In the absence of such control, the hearing aid amplifier is usually designed to achieve the greatest amplification of which it is capable, and this amplification prevails for incoming received acoustic energy of any loudness magnitude. As a consequence, for audio sounds of relatively large amplitude, the hearing aid amplifier without AGC is overdriven, resulting in clipping of both the positive and negative peaks of the amplified audio signal. Of course, the distortion introduced by such clipping is manifest in the output of the hearing aid output transducer, be it an ear phone or a bone conduction receiver, as annoying "banging" sounds which seriously decrease the intelligibility.

Overdriving of hearing aid amplifying systems in response to high-intensity sounds has been avoided in the past by the expedient of AGC circuits. Unfortunately, previously developed gain control circuits have introduced significant distortion to the amplified audio signal such that a marked lack of fidelity ensues in the hearing aid output. This distortion results from the fact that the AGC circuit itself presents a varying load to the amplifying system and therefore intermitently subtracts energy from the output signal of the system. Usually, the AGC circuit responds to the peak amplitude of either the positive or negative half cycles of the amplified audio to produce a unidirectional voltage of a magnitude determined by that peak amplitude for use in controlling the amplifier gain. The energy required in driving the AGC circuit in effect is "sliced" off either the positive or negative peaks of the audio signal, depending on the signal polarity to which the AGC circuit responds. The amplified audio signal delivered to the output transducer thus contains "sliced" portions, somewhat similar to a clipped signal, and introduces noticeable distortion. This distortion is particularly annoying and discomforting because it is non-symmetrical; that is to say only the peaks of one polarity are "sliced."

The present application, in accordance with one of its aspects, is addressed to a hearing aid having an automatic gain control arrangement wherein minimum distortion is introduced in the amplified audio signal delivered to the output transducer and wherein asymmetry of the amplified signal is avoided.

In addition to their objectionable distortion, prior AGC systems if applied to current hearing aids will not provide an automatic gain control voltage of sufficient magintude. Present hearing aid circuits are usually confined within a very small space, are fully transistorized, and are powered by a battery voltage source in the neighborhood of one volt, certainly not over one and one-half volts. A conventional AGC circuit using a germanium diode to effect half-wave rectification of the audio signal develops an AGC voltage of approximately one-half volt maximum which is insufficient since a control potential approaching one and one-quarter volts is required to achieve the desired range of gain control. In accordance with another aspect of the present invention, AGC of the desired spread is obtained for a transistorized hearing aid powered by such a battery.

Accordingly, it is an object of the present invention to provide a new and improved hearing aid apparatus of the type which is powered by a battery of not over one and one-half volts.

It is a particular object of the invention to provide a novel automatic gain control arrangement for such a hearing aid.

A hearing aid embodying the invention is of the type which operates from a battery power supply of not over one and one-half volts. The aid comprises a transistorized amplifying system for developing, in response to received acoustic energy, an amplified audio frequency signal representative of that acoustic energy. There are means, including a voltage doubling type of full wave rectifier coupled to the amplifying system, for peak rectifying both the positive and negative half cycles of the amplified audio signal to develop a control voltage having a magnitude determined by the instantaneous loudness of the received acoustic energy. Finally, there are means for applying that control voltage to the amplifying system to vary the gain thereof in a direction or sense tending to maintain the output of the system at constant amplitude in spite of variations in loudness of the received acoustic energy.

Figure 2:
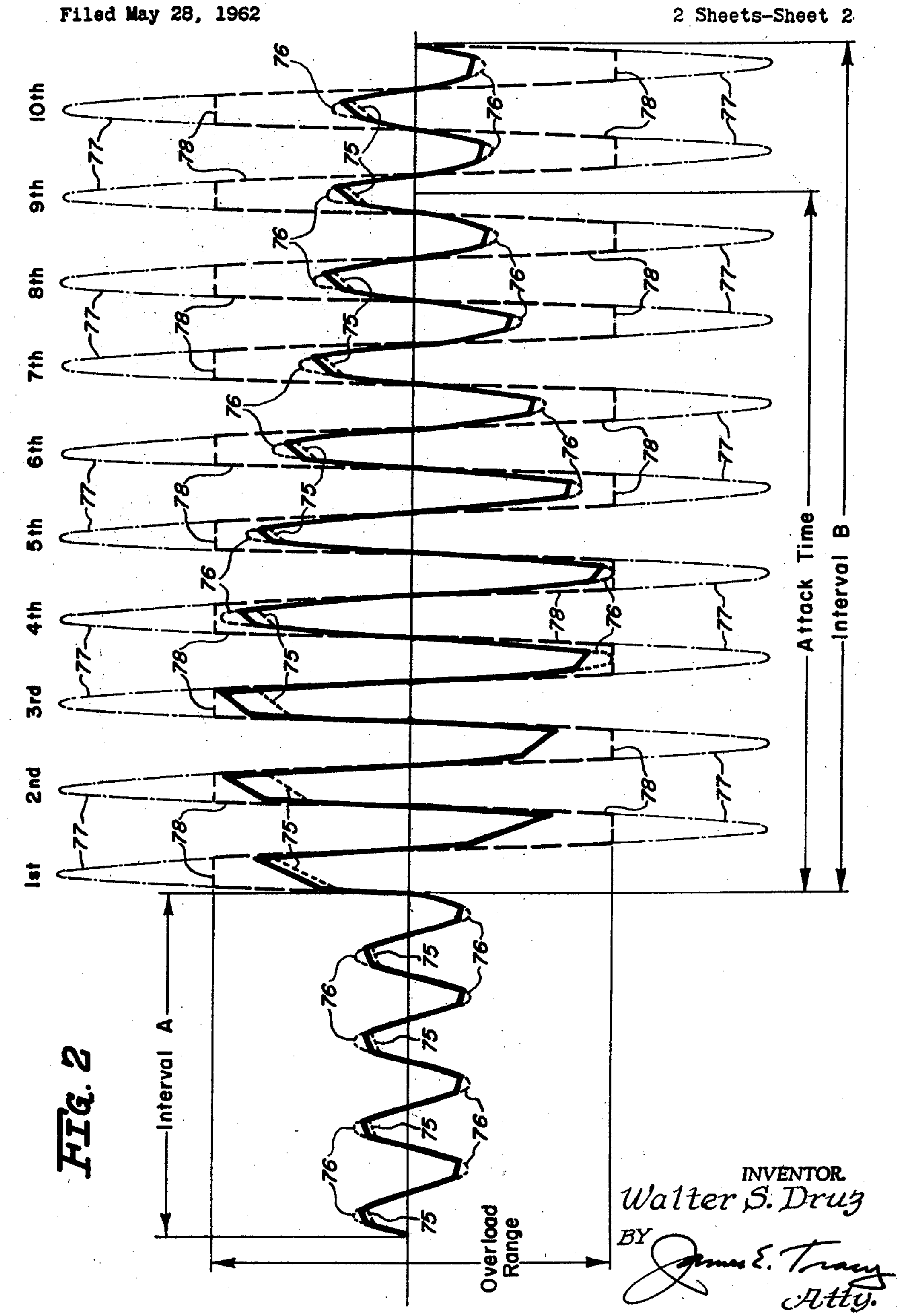

The features of this invtntion which are believed to be new are set forth with particularity in the appended claims. The invention, together with further objects and advantages thereof, may best be understood, however, by reference to the following description in conjunction with the accompanying drawings, in which:

FIGURE 1 illustrates a hearing aid, including an automatic gain control arrangement, constructed in accordance with one embodiment of the invention; and FIGURE 2 illustrates a family of waveforms helpful in understanding the operation of the hearing aid, and in demonstrating advantages achieved over prior hearing aid devices.

Turning now to FIGURE 1, the hearing aid there represented is of the type which operates from a battery power supply of not over one and one-half volts. It is a transistorized instrument of miniature form, being constructed for example within a temple bar of an eyeglass frame or being assembled in a tiny structure to be supported behind or even within the ear of the wearer. Since the physical structure of the aid, as distinguished from its circuitry, may be entirely conventional, it has not been illustrated. The aid comprises a magnetic microphone, schematically shown merely as a coil 10, having one terminal connected to the base 11 of a conventional PNP type junction transistor 12 and another terminal coupled through a condenser 14 to a plane of reference potential or ground. The emitter 15 of transistor 12 is also connected to ground and the collector 16 of the transistor is connected through a collector load resistance 18 and a decoupling resistor 19, connected in series, to the negative terminal of a source of unidirectional operating potential, shown as a battery 20, the positive terminal of which is connected to ground. The junction of resistors 18 and 19 is coupled to ground through a decoupling condenser 21. In this way, resistor 19 and condenser 21 decouple supply voltage source 20, with respect to the alternating audio components, from the transistor amplifying system. Collector 16 of transistor 12 is also coupled through a biasing resistor 23 to the junction of microphone 10 and condenser 14.

Collector 16 is additionally coupled through a D.C. blocking condenser 25 to the base 26 of another conventional PNP type junction transistor 28, the emitter 29 of which is coupled to ground. A resistor 31 is connected between collector 32 and base 26 of transistor 28 for biasing purposes. Collector 32 is connected through a collector load resistor 34 to the junction of resistor 19 and condenser 21, and is also coupled through a D.C. blocking condenser 37 to the base 38 of a conventional PNP type junction transistor 40, having an emitter 41 connected to ground. The collector 42 of transistor 40 is connected through a biasing resistor 43 to base 38 and is also connected through the primary winding 45 of an output transformer 46 to the negative terminal of battery 20. A center tapped secondary winding 47 of the transformer is coupled to the input of a conventional transistorized push-pull power amplifier 49, the output of which drives an output transducer in the form of an ear phone transducer 50. Of course, the output transducer may take a variety of different forms; for example, it may constitute a conventional bone conduction receiver.

As thus far described, the hearing aid amplifying system of FIGURE 1 is conventional, comprising three cascade-connected transistorized amplifying stages. In accordance with the present invention the instrument further includes an AGC arrangement of the voltage-doubling full-wave rectifier type to the end that the desired range of AGC control may be attained with distortion confined to an acceptable limit. More particularly, the AGC arrangement includes a voltage step-up secondary winding 53 of transformer 46, one terminal of which is grounded while the other terminal is connected through a resistor 54 to the input terminal of a conventional voltage doubler 55. Specifically, voltage doubler 55 includes a condenser 57 and a diode 58 connected in series, and in the order named, between resistor 54 and ground, the diode being positioned polarity-wise such that its cathode element is connected to ground. The junction 59 of condenser 57 and the anode of diode 58 is connected to ground through a diode 60 in series with a condenser 61 in the order named. Diode 60 is arranged such that its cathode is connected to junction 59. Junction 63, between condenser 61 and diode 60, constitutes the output of the voltage doubler and is connected through a pair of series-connected resistors 65 and 66 to base 26 of transistor 28, and also through a pair of series-connected resistors 68, 69 to the junction of magnetic microphone 10 and condenser 14. A condenser 71 couples the junction of resistors 65 and 66 to ground, and a condenser 72 couples the junction of resistors 68 and 69 to ground. The connections from unit 55 to transistors 12 and 28 constitute means for applying the AGC potential to the amplifying system to vary the gain thereof in a direction tending to maintain the output of the system at a constant amplitude in spite of variations in loudness of received acoustic energy.

In operation of the hearing aid of FIGURE 1, battery 20 along with the circuit components associated with the three transistor amplifying stages 12, 28 and 40, serves to bias all three stages to a class A operating mode. In other words, the base of each transistor is established at a negative direct voltage with respect to its associated emitter so that all of the base-emitter junctions are forward biased, the base-collector junctions being reverse or back biased. In this way, magnetic microphone 10 responds to received acoustic energy to produce an audio electrical signal, representative of the acoustic energy, for application between base 11 and emitter 15 of transistor 12. The signal is amplified in that transistor in normal fashion, the amplified replica being successively amplified in stages 28 and 40 in well known manner to produce in primary winding 45 of transformer 46 an amplified audio-frequency signal which in turn is further amplified in power amplifier 49 to develop a signal suitable for driving earphone output transducer 50. Ignoring the AGC circuit, an increase in loudness of the acoustic energy picked up by microphone 10 results in an amplified audio signal in each of the amplifying stages of increased peak-to-peak amplitude. Conversely, a decrease in loudness of the sound picked up is manifest in an amplified audio signal of decreased peak-to-peak amplitude.

Secondary winding 53 has a stepped-up turns ratio with respect to primary 45 so that a voltage stepped-up replica of the amplified audio signal developed by stage 40 appears across the secondary. The audio voltage contains both the positive and negative peaks of the amplified audio and is applied to voltage doubler 55 which develops in well known fashion a unidirectional voltage at junction 63 of negative polarity and having a magnitude double that of the peak amplitude. Briefly, during the half cycles of audio when the ungrounded terminal of secondary winding 53 is positive, only diode 58 conducts and condenser 57 charges to the peak amplitude, junction 59 thereby being established at that peak amplitude except with a negative polarity with respect to ground. In response to the alternate half cycles when the ungrounded terminal of winding 53 becomes negative, diode 58 cuts off and the negative peaks charge condenser 61 through diode 60. Due to the fact that junction 59 is established at a negative voltage level of a magnitude equal to the peak amplitude, condenser 61 effectively charges to the negative peak amplitude of the audio appearing on winding 53 plus the negative level of junction 59. The net result is that twice the peak voltage appears at junction 63 with respect to ground and this negative AGC voltage is applied through resistors 69 and 68 to base 11 of transistor 12 and through resistors 65 and 66 to base 26 of transistor 28. Of course, the greater the peak-to-peak amplitude of the audio signal developed in primary winding 45, the greater will be the magnitude, in a negative direction, of the automatic gain control voltage applied to bases 11 and 26.

As shown, the circuit employs "forword" AGC. To explain, gain is reduced by increasing the magnitude, in a forward bias direction, of the voltage applied to each base. Since transistors 12 and 28 are of the PNP variety, an increased negative voltage from voltage doubler 55 results in increased emitter-collector current in those transistors. Since the input impedance of a junction type transistor is a function of its equivalent emitter resistance, which in turn is a function of the emitter current, increasing the emitter-collector current results in a decreased input impedance, thereby decreasing the gain of the transistor.

Hence, voltage doubler 55 responds to both the positive and negative peaks of the amplified audio signal to develop an AGC voltage of negative polarity and of a magnitude determined by the instantaneous loudness of the incoming received acoustic energy; this automatic gain control voltage is utilized for regulating the gain of the amplifying system, decreasing the gain in response to an increase in loudness of the received sound and increasing the gain when the loudness decreases.

As mentioned previously, secondary winding 53 of transformer 46 develops a voltage stepped-up replica of the amplified audio applied to primary winding 45. Of course, the offset voltage of diodes 58 and 60 makes it desirable to have the stepped up voltage if an AGC potential of adequate strength is to be obtained. The offset voltage is the knee or bend at the start of diode conduction characteristic which must be exceeded before the diode starts to conduct heavily. Its value varies with the material from which the diode is made. For example, semi-conductor diodes formed of germanium have an offset voltage of about 0.3 while for silicon diodes it is 0.5 or 0.6 volt. By then doubling the peak amplitude of the signal developed in secondary 53 a unidirectional AGC voltage of a magnitude considerably greater than that of the audio voltage developed in the primary is produced for automatic gain control. Of course the AGC voltage may be increased further by employing a still higher turns ratio in the transformer 46 so that a greater voltage step-up is achieved. However, such an expedient requires a significant increase in the physical space occupied by the output transformer in a present-day miniaturized transistorized hearing aid where the entire hearing aid is contained in a relatively small housing, such as incorporated in a pair of spectacle frames. It has been found by employing a turns ratio of 2:1, along with the voltage doubler feature, an automatic gain control of sufficient magnitude is provided with a minimum space requirement.

In order to fully appreciate advantages gained with the described AGC circuit over prior arrangements, attention is directed to the signal waveforms shown in FIGURE 2 which are representative of signals driving an output transducer under various conditions. During Interval A in FIGURE 2, a relatively small amplitude sinusoidal signal, representative of received relatively low magnitude acoustic energy, is depicted. The waveform component shown in full-line construction is developed at the output of transistor 40 for application through amplifier 49 to output transducer 50. It will be noted that relatively small portions of both the positive and negative peaks are "sliced" or "bit" off inasmuch as the energy represented by those portions is required to drive the voltage doubler and the automatic gain control circuit. However, since the voltage doubler responds to both the positive and negative peaks of the amplified audio, the amount of "sliced" off those peaks is confined to a relatively insignficant amount, and because both the positive and negative peaks are treated alike, distortion attributable to asymmetry is avoided. In prior hearing aid amplifying systems employing automatic gain or volume control circuits of the single-ended or single-rectification type, amplitude peaks of only one polarity, for example positive, were utilized to develop the AGC voltage. Since the energy required for driving the AGC system was taken from only the positive half cycles of audio, the "bites" or "slices" had to be at least twice as much as necessitated by the voltage doubler arrangement of the present application. This is illustrated in Interval A by dotted waveform portions 75. Of course, the deviation of dotted lines 75 from a true sinusoidal wave, as shown by dotted lines 76, results in distortion in the signal applied to the output transducer. Moreover, since the "bites" are taken from only the positive peaks, the distortion introduced is of the non-symmetrical variety which is even more noticeable and annoying to the wearer of the hearing aid.

The hearing aid without any AGC would, of course, receive at the input of its output transducer a sinusoidal signal. However, with the voltage doubling arrangement of the present invention it has been found that the deviations from a true sinusoidal waveshape for a signal of the magnitude shown in Interval A do not manifest any appreciable distortion or decrease in intelligibility.

During interval B of FIGURE 2, the waveforms represent the action when the incoming acoustic energy increases substantially in magnitude from that during interval A. Again, during interval B the waveform component shown in full-line construction is produced for application to the output transducer in FIGURE 1. The sinusoidal signal 77 shown in dash-dot construction, ten cycles labeled 1st–10th of which are shown, illustrates that which would be produced by a hearing aid without automatic gain control, and having a capability of amplifying without distortion or clipping. Of course, even if a hearing aid did have such a capability, the amplitude of the output signal would be so great that the wearer of the hearing aid would suffer considerable discomfort because of the loudness or "banging" of the sound delivered by the output transducer.

As a practical matter, most hearing aids without AGC would have an overload range as shown in FIGURE 2; as a consequence, a considerable part of each positive and negative half cycle would be clipped due to overdriving the amplifying stages between saturation and cut-off. Hence, the clipped signal 78 shown in dashed construction would be applied to an output transducer during interval B in a hearing aid without AGC. The distortion introduced by the clipping is rather substantail, leading not only to discomfort to the wearer but resulting in markedly decreased intelligibility.

The described AGC circuit, however, handles the increase in sound intensity from interval A to interval B in meritorious fashion. During the initial or 1st cycle of the sinusoidal signal at the start of interval B, the automatic gain control circuit represents a rather substantial load on the amplifying system since the condensers therein must charge up to the new voltage level which will prevail for the loudness intensity of the sound during interval B. Thus, considerable portions of the positive and negative peaks of the 1st cycle in interval B are "sliced" off because of the loading. This prevents overdriving of the amplifying system, which would lead to clipping, during the attack time of the AGC system. The "attack time" is the time interval required to achieve a decrease in gain in response to an increase in loudness of received acoustic energy, and for the circuit of FIGURE 1 is fully explained in the copending patent application Serial No. 198,129, filed concurrently herewith in the name of Kenneth R. Wruk. For reasons enumerated in the Wruk application, it is desirable that the attack time exceed a predetermined minimum time duration. Since the AGC circuit serves as a substantial load during the beginning of that attack time, there is no opportunity for the amplifying system to be overdriven during the period that the AGC circuit begins to charge up to the new gain control voltage and before the gain is reduced to a point within the overload range.

In the 2nd and 3rd cycles of the sinusoidal signal during interval B the "slices" taken off by the AGC circuit are progressively smaller since during that time the condensers provide a decreasing load. By the time the sinusoidal signal is into the second half of the 3rd cycle, the condensers in the gain control circuit will have become charged to the extent that automatic gain control action begins to occur or take hold, namely the gain of each of transistor stages 12 and 28 begins to decrease. From the 4th to the 9th cycles of the sinusoidal signal during interval B the AGC circuit continues to function, and the condensers continue to charge, in response to the loudness of the acoustic energy in order that the gain of the amplifying system is decreased to an extent that the amplified audio signal developed for application to the output transducer, after the condensers in the automatic gain control circuit have become fully charged to the new control voltage, is well within the overload range of the system and only slightly greater in amplitude than the signal applied to the output transducer during interval A in response to a signal of considerably less magnitude. From the 9th cycle on, assuming no decrease in loudness of the incoming acoustic energy, the signal applied to the output transducer would be similar to that shown during the 9th and 10th cycles. Since the AGC circuit does not charge up completely to the new control voltage in response to increased loudness until the 9th cycle, the time duration represented from the start of interval B to the 9th cycle illustrates the attack time. For a signal of different frequency than that shown in FIGURE 2 the attack time would require more or less than nine cycles, depending on whether the frequency increases or decreases.

Again, dotted lines 75 indicate the amount of signal that would be "sliced" during interval B with previously developed single-rectification AGC circuits. As discussed, such previous arrangements introduce greater distortion because of asymmetry. The wave shape of the signal applied to the output transducer during the negative half cycles of the 1st through 4th cycles, in a hearing aid with a single-ended AGC circuit, is also represented by the clipped signal 78 shown in dashed construction. Clipping, of course, because AGC action has not yet taken hold and because loading of the single-rectification AGC system prevails only during the positive peaks.

The deviations from a true sinusoidal shape, as outlined by dotted lines 76, by the full-line waveform achieved by the present invention are not significant enough to be manifest as noticeable distortion in the signal delivered to the output transducer. Hence, automatic gain control is achieved with a minimum of distortion, especially when compared with AGC arrangements utilized in previous hearing aids. Moreover, extremely effective AGC is realized with the present invention in a hearing aid powered by a battery roughly in the one volt range.

The circuit of FIGURE 1 has been constructed and successfully operated by utilizing the following circuit parameters:

| | |
|---|---|
| Microphone **10** | R=850 ohms, $X_L$=3500 ohms @ 1 kc. |
| Transistors **12, 28, 40** | CK891, CK891, CK892. |
| Resistor **23** | 22K ohms. |
| Condenser **14** | .1 mfd. |
| Resistor **18** | 1500 ohms. |
| Resistor **69** | 3900 ohms. |
| Condenser **72** | 4 mfd. |
| Resistor **68** | 3900 ohms. |
| Condenser **25** | 4 mfd. |
| Resistor **66** | 3900 ohms. |
| Condenser **71** | 10 mfd. |
| Resistor **65** | 3900 ohms. |
| Resistor **31** | 27K ohms. |
| Resistor **34** | 1500 ohms. |
| Condenser **37** | 1 mfd. |
| Resistor **43** | 39K ohms. |
| Resistor **19** | 270 ohms. |
| Condenser **21** | 40 mfd. |
| Battery **20** | 1.3 volts mercury. |
| Voltage step-up ratio between windings **45** and **53** | 2:1. |
| Resistor **54** | 2200 ohms. |
| Condenser | 4 mfd. |
| Diodes **58** and **60** | HT2149. |
| Condenser **61** | 10 mfd. |

While a particular embodiment of the invention has been shown and described, modifications may be made, and it is intended in the appended claims to cover all such modifications as may fall within the true spirit and scope of the invention.

I claim:

1. A hearing aid of the type which operates from a battery power supply of not over one and one-half volts comprising:

a transistorized amplifying system for developing, in response to received acoustic energy of varying loudness, an amplified audio signal representative of said acoustic energy and having saturation and cutoff levels defining a predetermined overload range;

an output transformer, included in said transistorized amplifying system, having one output winding for connection to an output transducer and having a second voltage step-up output winding;

voltage developing means, including a voltage doubler having a full wave rectifier for peak rectifying both the positive and negative half cycles of said amplified audio signal and also having an input coupled to said second output winding and having an output, storage condenser means, and charging circuitry for said storage condenser means coupled to the output of said voltage doubler for charging said storage condenser means in response to an increase in loudness of said incoming received acoustic energy to develop in said storage condenser means an automatic gain control voltage having a magnitude proportional to the peak-to-peak audio amplitude and determined by the instantaneous loudness of said received acoustic energy, said charging circuitry and storage condenser means collectively establishing an attack time of predetermined minimum duration;

discharging circuitry for discharging said storage condenser means in response to a decrease in loudness of said received acoustic energy to decrease the magnitude of said automatic gain control voltage;

and means for applying said automatic gain control voltage to said transistorized amplifying system to vary the gain thereof in a direction tending to maintain the operation of said amplifying system within said overload range and to maintain the output of said system at a constant amplitude in spite of variations in loudness of said received acoustic energy, said storage condenser means presenting a substantial load on said amplifying system during said attack time to prevent overdriving of said amplifying system beyond said overload range until said automatic gain control voltage reduces the gain of said system to a point within said range.

2. A hearing aid of the type which operates from a battery power supply of not over one and one-half volts comprising:

a multi-stage transistorized amplifying system for developing, in response to received acoustic energy of varying loudness, an amplified audio signal representative of said acoustic energy and having saturation and cutoff levels defining a predetermined overload range, each amplifying stage including a transistor having input and output circuits;

an output transformer, included in said transistorized amplying system, having one output winding for connection to an output transducer and having a second voltage step-up output winding;

voltage developing means, including a voltage doubler having a full wave rectifier for peak rectifying both the positive and negative half cycles of said amplified audio signal and also having an input coupled to said second output winding and having an output, storage condenser means, and charging circuitry for said storage condenser means coupled to the output of said voltage doubler, for charging said storage condenser means in response to an increase in loudness of said incoming received acoustic energy to develop in said storage condenser means an automatic gain control voltage having a magnitude proportional to the peak-to-peak audio amplitude and determined by the instantaneous loudness of said received acoustic energy, said charging circuitry and storage condenser means collectively establishing an attack time of predetermined minimum duration;

discharging circuitry for discharging said storage condenser means in response to a decrease in loudness of said received acoustic energy to decrease the magnitude of said automatic gain control voltage;

and means for applying said automatic gain control voltage as a variable forward bias to the input circuit of at least one of said transistors to vary the input impedance thereof, thereby to vary the gain of said amplifying system in a direction tending to maintain the operation of said amplifying system within said overload range and to maintain the output of said system at a constant amplitude in spite of variations in loudness of said received acoustic energy, said storage condenser means presenting a substantial load on said amplifying system during said attack time to prevent overdriving of said amplifying system beyond said overload range until said automatic gain control voltage reduces the gain of said system to a point within said range.

3. A hearing aid of the type which operates from a battery power supply of not over one and one-half volts comprising:

a transistorized amplifying system for developing in response to received acoustic energy of varying loudness, an amplifier audio signal representative of said acoustic energy and having saturation and cutoff levels defining a predetermined overload range;

voltage developing means, including a voltage doubler having a full wave rectifier for peak rectifying both the positive and negative half cycles of said amplified audio signal and also having an input coupled to the output of said transistorized amplifying system and having an output, storage condenser means, and charging circuitry for said storage condenser means coupled to the output of said voltage doubler, for charging said storage condenser means in response to an increase in loudness of said incoming received acoustic energy to develop in said storage condenser means an automatic gain control voltage having a magnitude proportional to the peak-to-peak audio amplitude and determined by the instantaneous loudness of said received acoustic energy, said charging circuitry and storage condenser means collectively establishing an attack time of predetermined minimum duration;

a pair of semi-conductor diodes, included in said voltage doubler, having an offset voltage which is a substantial fraction of the nominal battery voltage of the hearing aid;

discharging circuitry for discharging said storage condenser means in response to a decrease in loudness of said received acoustic energy to decrease the magnitude of said automatic gain control voltage;

and means for applying said automatic gain control voltage to said transistorized amplifying system to vary the gain thereof in a direction tending to maintain the operation of said amplifying system within said overload and to maintain the output of said system at a constant amplitude in spite of variations in loudness of said received acoustic energy, said storage condenser means presenting a substantial load on said amplifying system during said attack time to prevent overdriving of said amplifying system beyond said overload range until said automatic gain control voltage reduces the gain of said system to a point within said range.

4. A hearing aid of the type which operates from a battery power supply of not over one and one-half volts comprising:

a transistorized amplifying system for developing, in response to received acoustic energy of varying loudness, an amplified audio signal representative of said acoustic energy and having saturation and cutoff levels defining a predetermined overload range;

voltage developing means, including a voltage doubler having a full wave rectifier for peak rectifying both the positive and negative half cycles of said amplified audio signal and also having an input coupled to the output of said transistorized amplifying system and having an output, storage condenser means, and charging circuitry for said storage condenser means, for charging said storage condenser means in response to an increase in loudness of said incoming received acoustic energy to develop in said storage condenser means an automatic gain control voltage having a magnitude proportional to the peak-to-peak audio amplitude and determined by the instantaneous loudness of said received acoustic energy, said charging circuitry and storage condenser means collectively establishing an attack time of predetermined minimum duration;

a pair of semi-conductor diodes, included in said voltage doubler, having an offset voltage at least approximately equal to three-tenths of a volt;

discharging circuitry for discharging said storage condenser means in response to a decrease in loudness of said received acoustic energy to decrease the magnitude of said automatic gain control voltage;

and means for applying said automatic gain control voltage to said transistorized amplifying system to vary the gain thereof in a direction tending to maintain the operation of said amplifying system within said overload range and to maintain the output of said system at a constant amplitude in spite of variations in loudness of said received acoustic energy, said storage condenser means presenting a substantial load on said amplifying system during said attack time to prevent overdriving of said amplifying system beyond said overload range until said automatic gain control voltage reduces the gain of said system to a point within said range.

References Cited by the Examiner

UNITED STATES PATENTS

| | | | |
|---|---|---|---|
| 2,288,434 | 6/42 | Bradley | 330—141 X |
| 2,462,452 | 2/49 | Yates | 330—138 X |
| 2,824,177 | 2/58 | Tado | 330—29 X |
| 2,949,533 | 8/60 | Read | 330—29 X |
| 3,021,489 | 2/62 | Nielsen | 330—29 |

ROY LAKE, *Primary Examiner*.